US012684693B2

(12) United States Patent
Ueno

(10) Patent No.: US 12,684,693 B2
(45) Date of Patent: Jul. 14, 2026

(54) SENSOR MODULE

(71) Applicant: SEIKO EPSON CORPORATION, Tokyo (JP)

(72) Inventor: Hitoshi Ueno, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 382 days.

(21) Appl. No.: 18/086,711

(22) Filed: Dec. 22, 2022

(65) Prior Publication Data

US 2023/0209716 A1 Jun. 29, 2023

(30) Foreign Application Priority Data

Dec. 27, 2021 (JP) ................................. 2021-212437

(51) Int. Cl.
| | |
|---|---|
| *G01C 19/5783* | (2012.01) |
| *G01P 15/08* | (2006.01) |
| *H05K 1/181* | (2026.01) |
| *H05K 3/341* | (2026.01) |

(52) U.S. Cl.
CPC .......... H05K 1/181 (2013.01); G01P 15/0888 (2013.01); H05K 3/3421 (2013.01)

(58) Field of Classification Search
None
See application file for complete search history.

(56) References Cited

U.S. PATENT DOCUMENTS

| | | | | | |
|---|---|---|---|---|---|
| 4,164,778 | A | * | 8/1979 | Sawairi | H05K 1/111 |
| | | | | | 361/779 |
| 5,406,458 | A | * | 4/1995 | Schutt | H05K 3/3442 |
| | | | | | 361/767 |

| | | | | | |
|---|---|---|---|---|---|
| 10,264,664 | B1 | * | 4/2019 | Vinciarelli | H05K 3/0026 |
| 2011/0167912 | A1 | * | 7/2011 | Ohta | G01P 15/125 |
| | | | | | 73/504.12 |
| 2012/0106112 | A1 | * | 5/2012 | Knies | H01L 21/561 |
| | | | | | 29/874 |
| 2016/0231111 | A1 | * | 8/2016 | Yamamoto | G01C 19/5607 |
| 2022/0364864 | A1 | * | 11/2022 | Ueda | G01D 11/30 |

FOREIGN PATENT DOCUMENTS

| | | | | |
|---|---|---|---|---|
| JP | 2008051629 | A | * | 3/2008 |
| JP | 2008-211151 | A | | 9/2008 |

OTHER PUBLICATIONS

Title: What Causes Component Rotation During Reflow?; URL: https://www.circuitnet.com/experts/86914.html (Year: 2015).*

* cited by examiner

*Primary Examiner* — Stephen D Meier
*Assistant Examiner* — Ruben C Parco, Jr.
(74) *Attorney, Agent, or Firm* — Harness, Dickey & Pierce, P.L.C.

(57) ABSTRACT

A sensor module includes a circuit board, a sensor element having a detection axis along a planar direction of the circuit board, a sensor package accommodating the sensor element and mounted on the circuit board, a board land pattern used for mounting the sensor package disposed on the circuit board, and a package electrode disposed on a mounting surface of the sensor package facing the circuit board and joined to the board land pattern by a solder. A relationship of Xp≤X1 is satisfied, in which Xp is a width of the board land pattern in a first direction along the planar direction of the circuit board, and X1 is a width of the package electrode in the first direction.

4 Claims, 12 Drawing Sheets

SENSOR MODULE

The present application is based on, and claims priority from JP Application Serial Number 2021-212437, filed Dec. 27, 2021, the disclosure of which is hereby incorporated by reference herein in its entirety.

BACKGROUND

1. Technical Field

The present disclosure relates to a sensor module.

2. Related Art

In recent years, in order to detect angular accelerations around two or three orthogonal axes, a sensor module in which two or three gyro sensors are arranged in a manner in which detection axes of the gyro sensors are orthogonal to one another has been developed. As such a sensor module, for example, JP-A-2008-51629 discloses a sensor module including two packages that are surface-mounted on a wiring board and accommodate sensor vibrator elements of which detection axes are parallel to the wiring board and are orthogonal to each other. A joining terminal serving as a package mounting land pattern at a wiring board side is larger than a mounting terminal serving as a package mounting package electrode in a plan view.

However, in the sensor module described in JP-A-2008-51629, since the package mounting land pattern at a package side is larger than the package mounting package electrode, there is a problem that a package rotationally moves in a planar direction of the wiring board due to surface tension of a melted solder at the time of a solder reflow for mounting the package on the wiring board, and a direction of a detection axis changes with the rotation, which leads to deterioration of detection accuracy.

SUMMARY

A sensor module includes: a circuit board; a sensor element having a detection axis along a planar direction of the circuit board; a sensor package accommodating the sensor element and mounted on the circuit board; a board land pattern used for mounting the sensor package on the circuit board; and a package electrode disposed on a mounting surface of the sensor package facing the circuit board and joined to the board land pattern by a solder. A relationship of Xp≤X1 is satisfied, in which Xp is a width of the board land pattern in a first direction along the planar direction of the circuit board, and X1 is a width of the package electrode in the first direction.

DESCRIPTION OF EXEMPLARY EMBODIMENTS

1. First Embodiment

First, a sensor module 1 according to a first embodiment will be described with reference to FIGS. 1 to 6.

Figure 2:
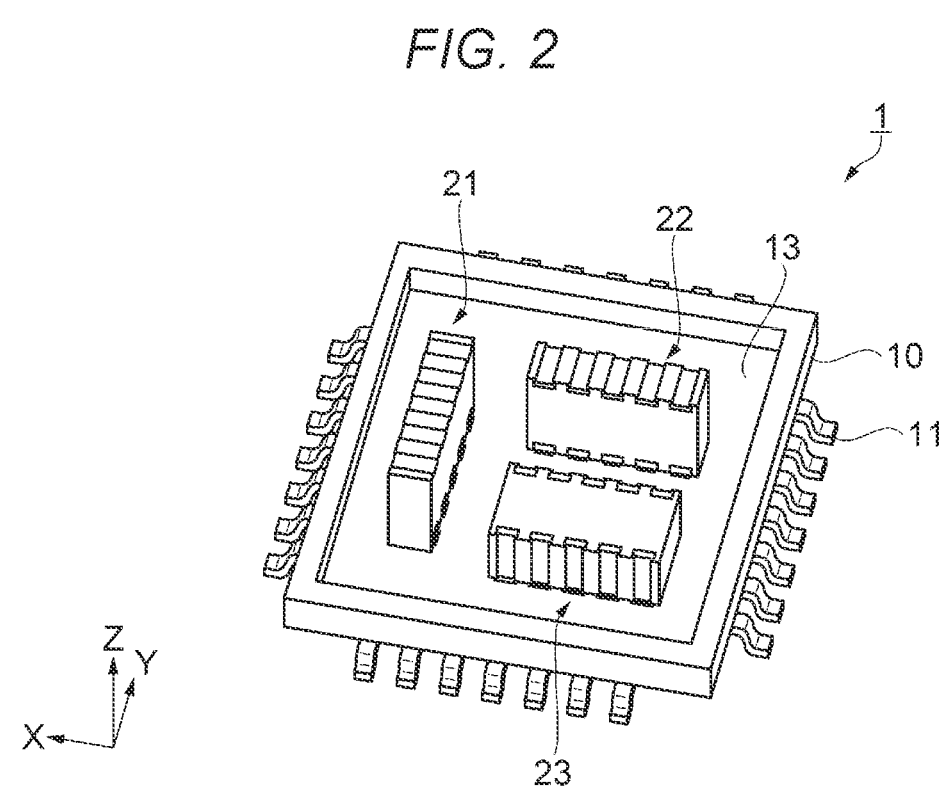
FIG. 2 is a perspective view showing an internal structure of the sensor module.
Figure 3:
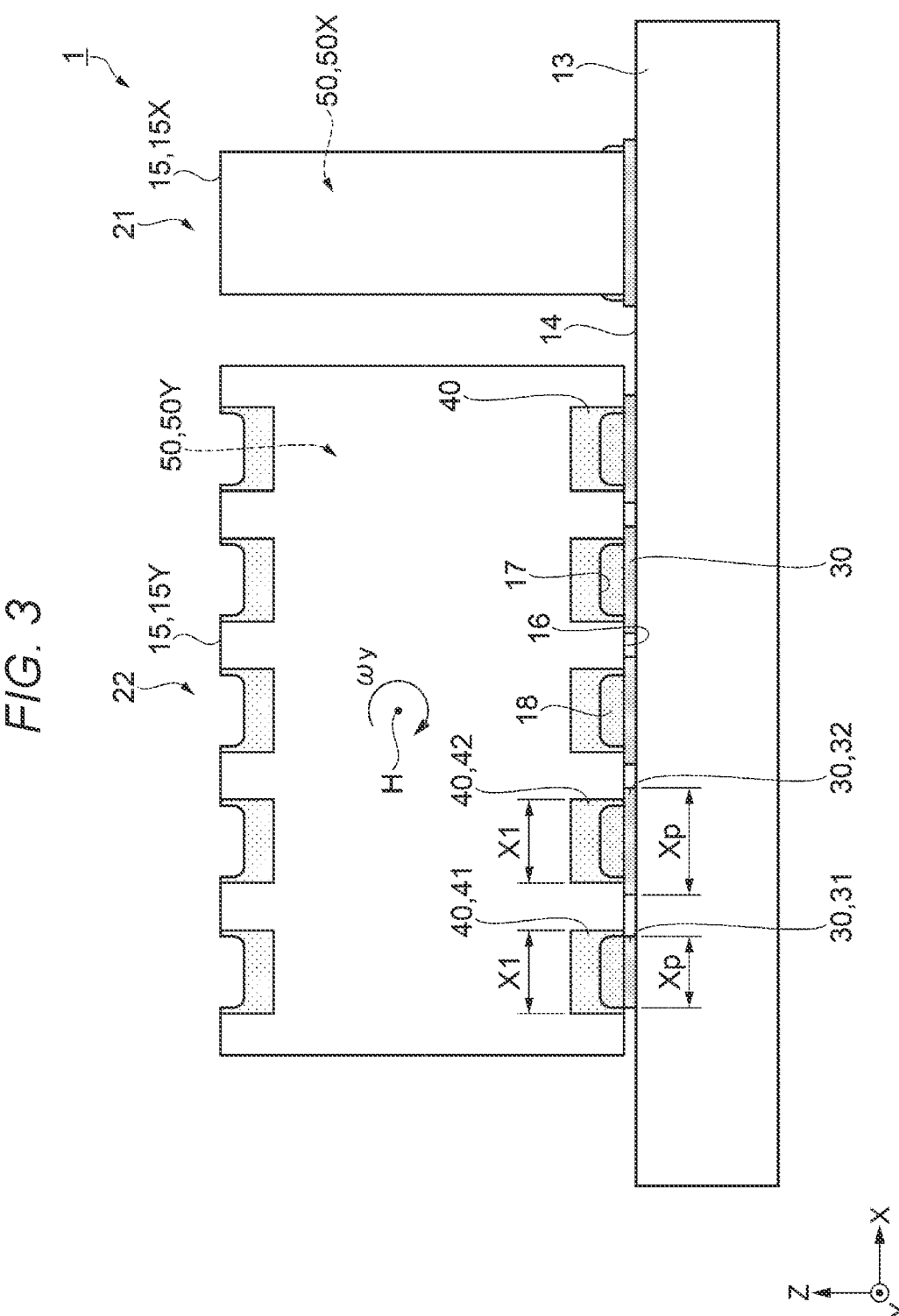
FIG. 3 is a side view showing the internal structure of the sensor module.
Figure 5:
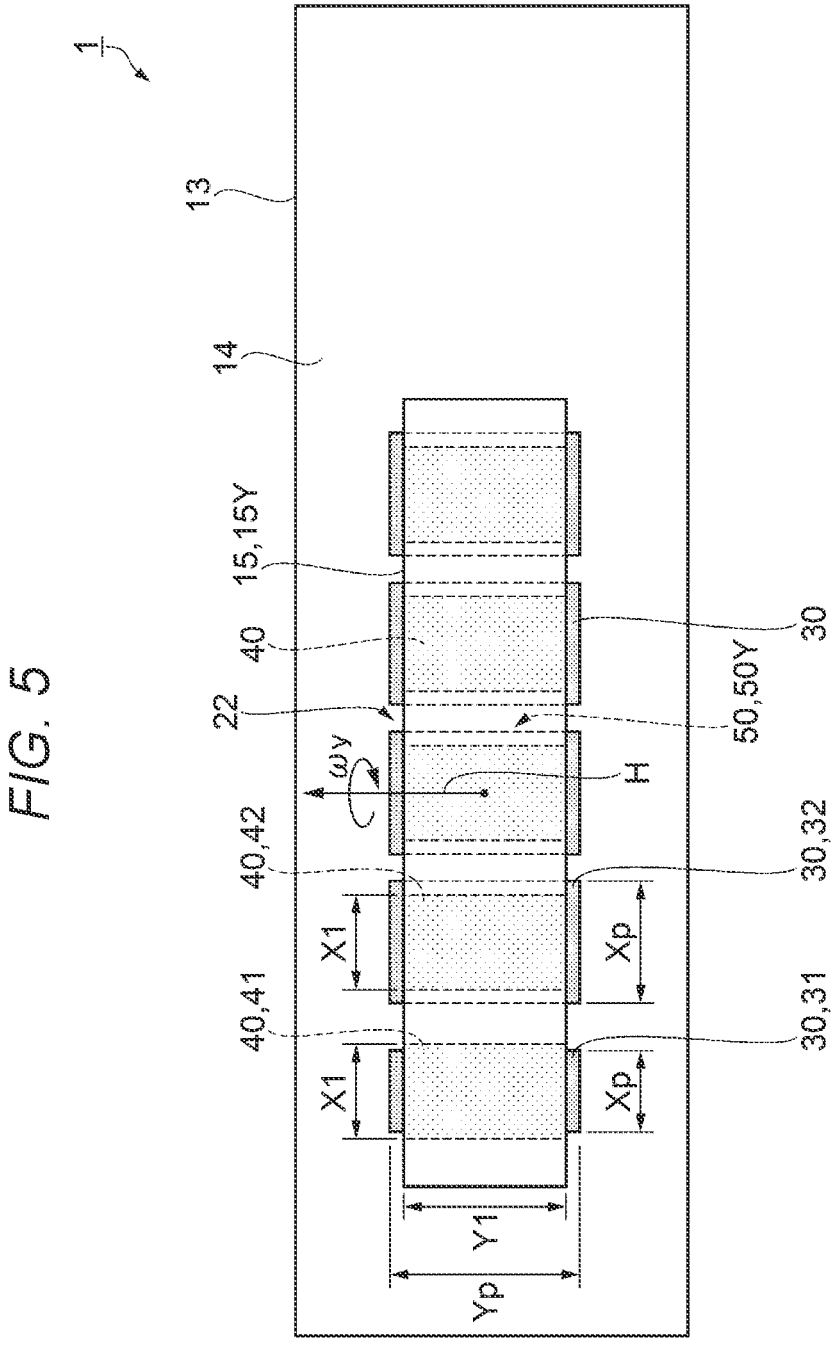
FIG. 5 is a plan view showing a positional relationship between board land patterns of a circuit board and the package electrodes of the sensor package.
Figure 5:
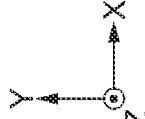

Inertial sensors 21, 22, and 23 provided in the sensor module 1 will be described as an example of a gyro sensor that detects an angular velocity around a detection axis H. FIG. 2 shows a state in which a metal cap 12 is removed for the convenience of description. FIG. 3 is a side view as viewed from a positive side in a Y direction. In FIGS. 2, 3, and 5, wirings and circuit components such as resistors and capacitors provided on a circuit board 13 are not shown.

In the following perspective view, side view, and plan view, an X axis, a Y axis, and a Z axis are shown as three axes orthogonal to one another. A direction along the X axis is referred to as an "X direction", a direction along the Y axis is referred to as a "Y direction", and a direction along the Z axis is referred to as a "Z direction". An arrow side of each axis is referred to as a "positive side", and an opposite side to the arrow is referred to as a "negative side".

Figure 1:
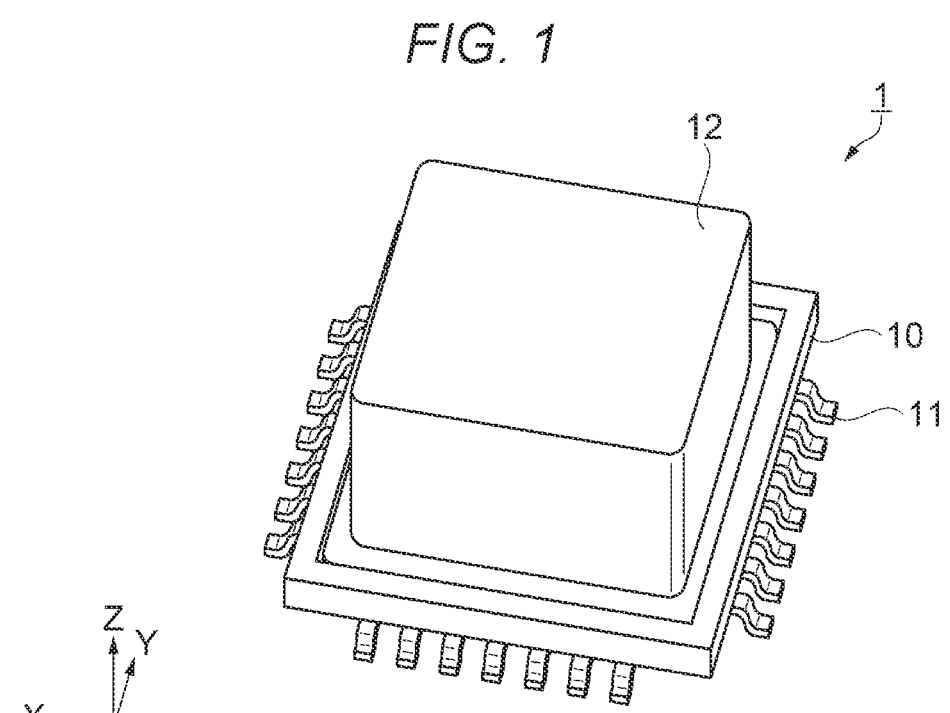
FIG. 1 is a perspective view showing a schematic structure of a sensor module according to a first embodiment.

As shown in FIGS. 1 and 2, the sensor module 1 according to the present embodiment includes a plurality of lead frames 11, a base portion 10 made of a mold resin, the circuit board 13 disposed in the base portion 10, the metal cap 12 that covers the circuit board 13 and is joined to the base portion 10, and three inertial sensors 21, 22, and 23 mounted on the circuit board 13. The first inertial sensor 21 is a gyro sensor that detects an angular velocity around the X axis with a detection axis H being the X axis, the second inertial sensor 22 is a gyro sensor that detects an angular velocity around the Y axis with a detection axis H being the Y axis, and the third inertial sensor 23 is a gyro sensor that detects an angular velocity around the Z axis with a detection axis H being the Z axis.

The circuit board 13 is a flat plate, and a plurality of board land patterns 30 for mounting sensor packages 15 that accommodate sensor elements 50 are disposed on a flat surface 14 which is an upper surface of the circuit board 13, and the sensor package 15 is mounted on the board land pattern 30 via a solder 18. The third inertial sensor 23 includes the sensor element 50 having a detection axis H orthogonal to a direction of the flat surface 14 of the circuit board 13. Therefore, the third inertial sensor 23 is mounted such that upper and lower surfaces of the third inertial sensor 23 are parallel to the flat surface 14 of the circuit board 13.

However, the first inertial sensor 21 and the second inertial sensor 22 each include the sensor element 50 having a detection axis H along the direction of the flat surface 14 of the circuit board 13. That is, the first inertial sensor 21 accommodates a first sensor element 50X in a first sensor package 15X, and a detection axis H of the first sensor element 50X is the X axis along the direction of the flat surface 14 of the circuit board 13. The second inertial sensor 22 accommodates a second sensor element 50Y in a second sensor package 15Y, and a detection axis H of the second sensor element 50Y is the Y axis along the direction of the flat surface 14 of the circuit board 13. That is, a direction of the detection axis H of the first sensor element 50X and a direction of the detection axis H of the second sensor element 50Y are different from each other. Therefore, as shown in FIG. 3, the first inertial sensor 21 and the second inertial sensor 22 are disposed in a manner of being orthogonal to each other, and are mounted in a manner in which a side surface of each of the first inertial sensor 21 and the second inertial sensor 22 serving as a mounting surface 16 is parallel to the flat surface 14 of the circuit board 13. That is, the first inertial sensor 21 and the second inertial sensor 22 are mounted on the circuit board 13 using the same mounting method. Therefore, a method of mounting the second inertial sensor 22 will be described below as an example.

Figure 4:
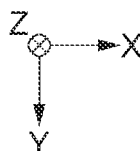
FIG. 4 is a plan view showing package electrodes provided in a sensor package.

As shown in FIGS. 3 and 4, a plurality of package electrodes 40 that are joined to the board land patterns 30 by the solders 18 are disposed in the second inertial sensor 22 on the mounting surface 16 of the second sensor package 15Y facing the circuit board 13. Castellations 17 are formed on the mounting surface 16 of the second sensor package 15Y, and the package electrodes 40 are disposed in the castellations 17.

As shown in FIG. 5, the board land pattern 30 provided on the circuit board 13 and the package electrode 40 provided in the second sensor package 15Y are disposed in a manner of overlapping each other in a plan view.

Figure 6:
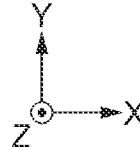
FIG. 6 is a diagram showing deviation of detection axes caused by a rotational movement of the sensor package.

When a width of the board land pattern 30 in the X direction that is a first direction along the direction of the flat surface 14 of the circuit board 13 is defined as Xp, and a width of the package electrode 40 in the X direction that is the first direction is defined as X1, a width Xp of a first board land pattern 31 is smaller than a width X1 of a first package electrode 41, and is equal to or smaller than the width X1 of the first package electrode 41, that is, Xp≤X1. A width Xp of a second board land pattern 32 is larger than a width X1 of a second package electrode 42. Since the width Xp of the first board land pattern 31 is set to be equal to or smaller than the width X1 of the first package electrode 41, as shown in FIG. 6, it is possible to reduce deviation of the detection axis H which occurs in a case where the width Xp of the board land pattern 30 is larger than the width X1 of the package electrode 40. That is, at least one of the first board land pattern 31 and the first package electrode 41 or the second board land pattern 32 and the second package electrode 42 satisfies Xp≤X1. Therefore, by forming at least one board land pattern 30 of which the width Xp of the board land pattern 30 is equal to or smaller than the width X1 of the package electrode 40, it is possible to prevent a situation in which the sensor package 15 rotationally moves in the direction of the flat surface 14 of the circuit board 13 due to surface tension of the melted solder 18 at the time of a solder reflow for mounting the sensor package 15 on the circuit board 13, a detection axis H1 deviates from a predetermined detection axis H by an angle θ along with the rotation, and detection accuracy deteriorates.

When a width of the board land pattern 30 in the Y direction that is a second direction intersecting the first direction along the direction of the flat surface 14 of the circuit board 13 is defined as Yp, a width of the package electrode 40 in the Y direction that is the second direction is defined as Y1, the width Yp of the board land pattern 30 is larger than the width Y1 of the package electrode 40 and satisfies Yp>Y1. Since the width Yp of the board land pattern 30 is set to be larger than the width Y1 of the package electrode 40, a fillet is formed in a portion where the board land pattern 30 and the sensor package 15 do not overlap with each other in a plan view, joining strength can be increased, and joining reliability can be improved.

Next, the inertial sensors 21, 22, and 23 provided in the sensor module 1 will be described with reference to FIGS. 7 and 8.

Since the three inertial sensors 21, 22, and 23 have the same structure, the third inertial sensor 23 will be described as an example. A lid 47 is not shown in FIG. 7 for the convenience of description. In FIGS. 7 and 8, illustration of a wiring that electrically connects the sensor element 50 and the package electrode 40 formed in the sensor package 15 and a drive electrode and a detection electrode formed in the sensor element 50 are omitted.

The third inertial sensor 23 is a uniaxial gyro sensor of which the detection axis H is the Z axis and that can measure an angular velocity around the Z axis. The sensor element 50 is a quartz crystal gyro sensor element manufactured by processing a quartz crystal board using a photolithography technique. The sensor element 50 converts vibration of a detection vibration arm into an electric signal and detects an angular velocity. Since quartz crystal is used as a base material, a temperature property is excellent. Therefore, as compared with a gyro sensor element manufactured using a MEMS technique, the quartz crystal gyro sensor element is less likely to be affected by external noises and temperature, and has high detection accuracy.

Figure 7:
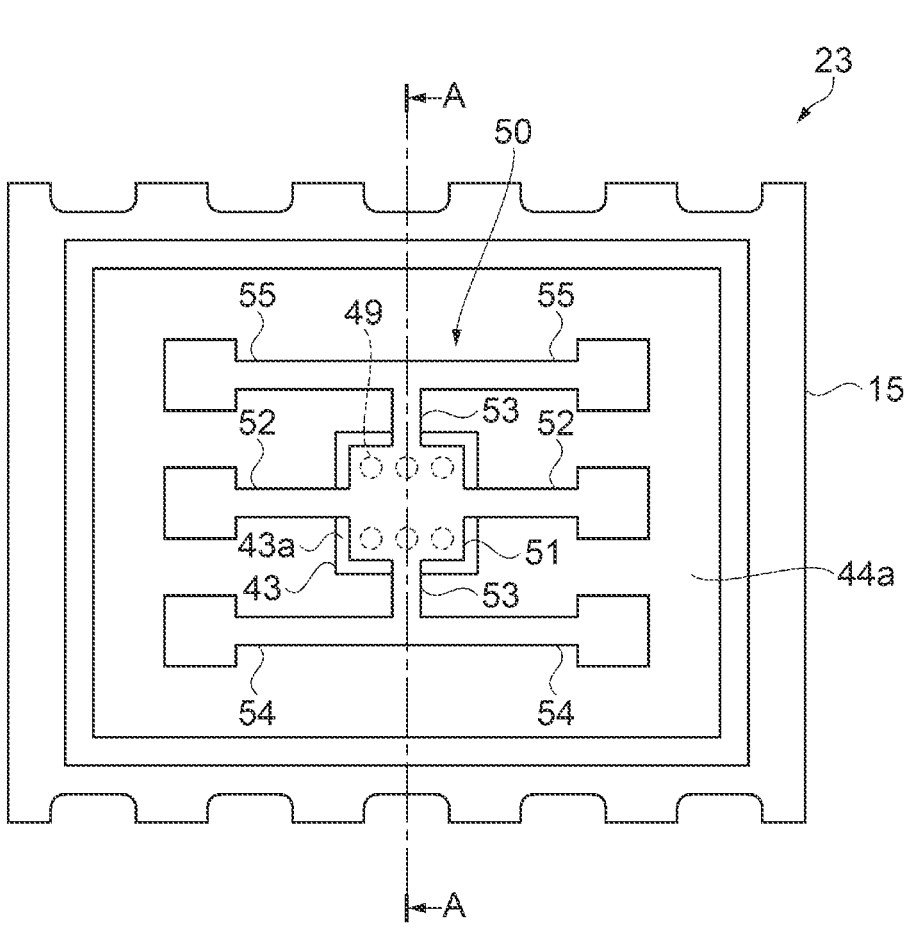
FIG. 7 is a plan view showing a schematic structure of a sensor element mounted in the sensor package.
Figure 7:
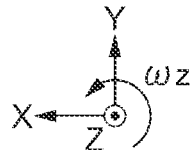
Figure 8:
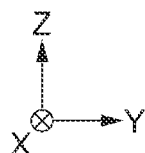
FIG. 8 is a cross-sectional view taken along a line A-A in FIG. 7.

As shown in FIGS. 7 and 8, the third inertial sensor 23 includes the sensor element 50, the sensor package 15 that is made of ceramic or the like and accommodates the sensor element 50, and the lid 47 made of glass, ceramic, metal, or the like.

The sensor package 15 is formed by stacking a plate-shaped first board 44, a frame-shaped second board 45, and a frame-shaped third board 46. The sensor package 15 has an internal space S that opens upward. The internal space S that accommodates the sensor element 50 is hermetically sealed in a depressurized state, preferably in a state close to vacuum, by joining the lid 47 with joining members 48 such as low-melting glass.

A protruding portion 43 protruding upward is formed on an inner bottom surface 44a of the sensor package 15, and the sensor element 50 is electrically and mechanically fixed to an upper surface 43a of the protruding portion 43 via metal bumps 49 or the like. Therefore, the sensor element 50 can be prevented from coming into contact with the first board 44.

The plurality of package electrodes 40 serving as mounting terminals are provided on a surface opposite to the inner bottom surface 44a of the sensor package 15. The package electrodes 40 are electrically coupled to the sensor element 50 via a wiring (not shown).

The sensor element 50 includes a base portion 51 located at a central portion, a pair of detection vibration arms 52 extending in the X direction from the base portion 51, a pair of coupling arms 53 extending in the Y direction from the base portion 51 in a manner in which the coupling arms 53 are orthogonal to the detection vibration arms 52, and a pair of drive vibration arms 54 and a pair of drive vibration arms 55 extending in the X direction from respective tip end sides of the coupling arms 53 in a manner in which the drive vibration arms 54 and the drive vibration arms 55 are parallel to the detection vibration arms 52. At the base portion 51, the sensor element 50 is electrically and mechanically fixed, via the metal bumps 49 or the like, to the upper surface 43a of the protruding portion 43 provided on the sensor package 15.

In the sensor element 50, when an angular velocity ωz around the Z axis is applied in a state in which the drive vibration arms 54 and 55 flexurally vibrate in the Y direction in opposite phases, a Coriolis force in the X direction acts on the drive vibration arms 54 and 55 and the coupling arms 53, and the drive vibration arms 54 and 55 and the coupling arms 53 vibrate in the X direction. Due to this vibration, the detection vibration arms 52 flexurally vibrate in the Y direction. Therefore, detection electrodes formed on the detection vibration arms 52 detect distortion of the quartz crystal generated due to the vibration as an electric signal, thereby calculating the angular velocity ωz.

Although a quartz crystal gyro sensor is described as an example of the inertial sensors 21, 22, and 23 in the present embodiment, the present disclosure is not limited thereto, and a silicon gyro sensor manufactured using the MEMS technique may be used as the inertial sensors 21, 22, and 23. The inertial sensors 21, 22, and 23 may be an acceleration sensor instead of a gyro sensor.

As described above, in the sensor module 1 according to the present embodiment, the board land pattern 30 in which the width Xp of the board land pattern 30 is equal to or smaller than the width X1 of the package electrode 40 is formed on the circuit board 13. Therefore, it is possible to prevent a situation in which the sensor package 15 rotationally moves in the direction of the flat surface 14 of the circuit board 13 due to surface tension of the melted solder 18 at the time of a solder reflow for mounting the sensor package 15 on the circuit board 13, and the detection axis H1 deviates from the predetermined detection axis H by the angle θ along with the rotation. Therefore, it is possible to prevent deterioration of detection accuracy due to deviation of the detection axis H, and the sensor module 1 having excellent detection accuracy can be obtained.

Since the width Yp of the board land pattern 30 is set to be larger than the width Y1 of the package electrode 40, a fillet is formed in the portion where the board land pattern 30 and the sensor package 15 do not overlap with each other in a plan view, joining strength of the circuit board 13 and the sensor package 15 can be increased, and joining reliability of the circuit board 13 and the sensor package 15 can be improved. Therefore, the sensor module 1 having high reliability can be obtained.

2. Second Embodiment

Figure 9:
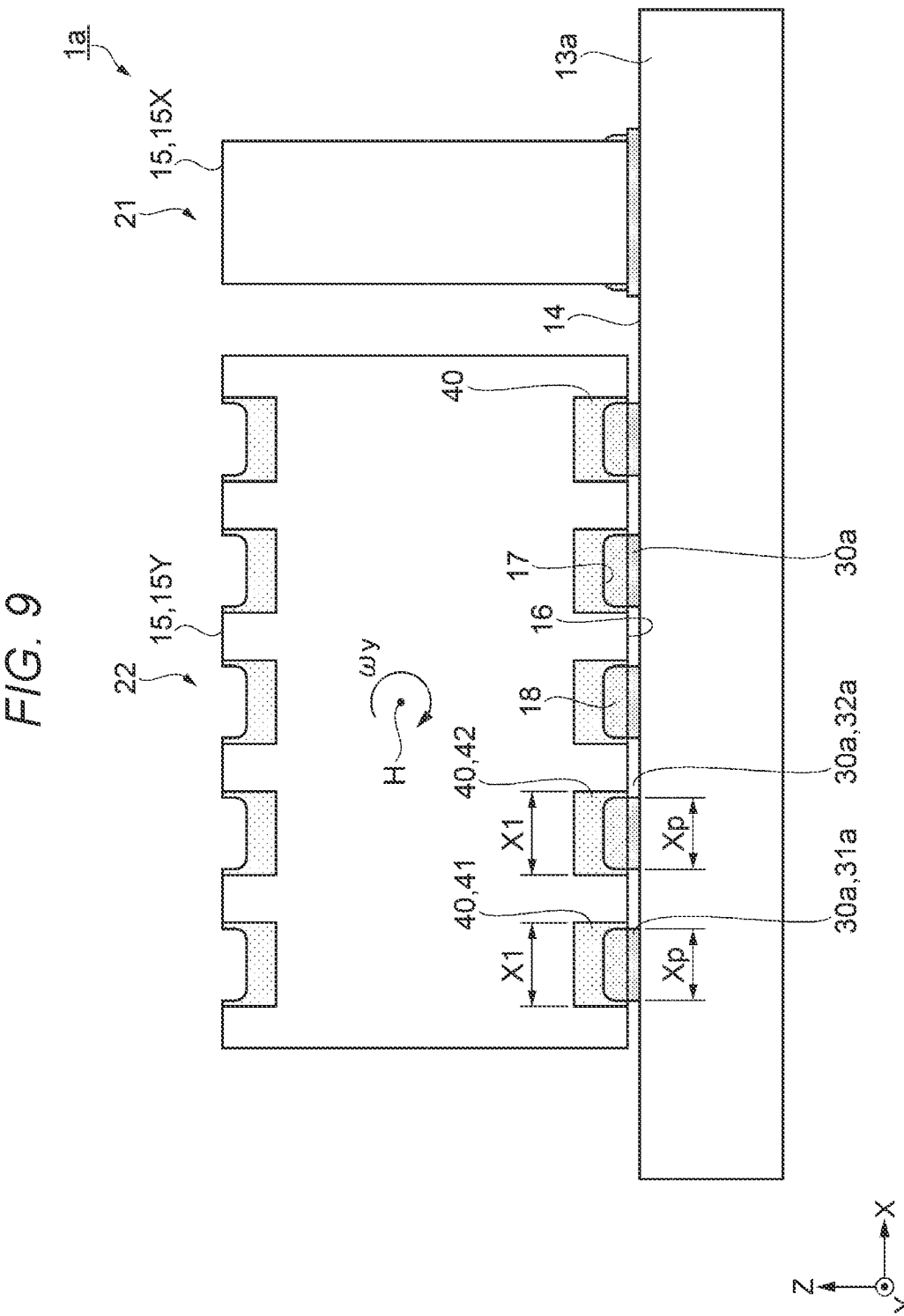
FIG. 9 is a side view showing an internal structure of a sensor module according to a second embodiment.
Figure 10:
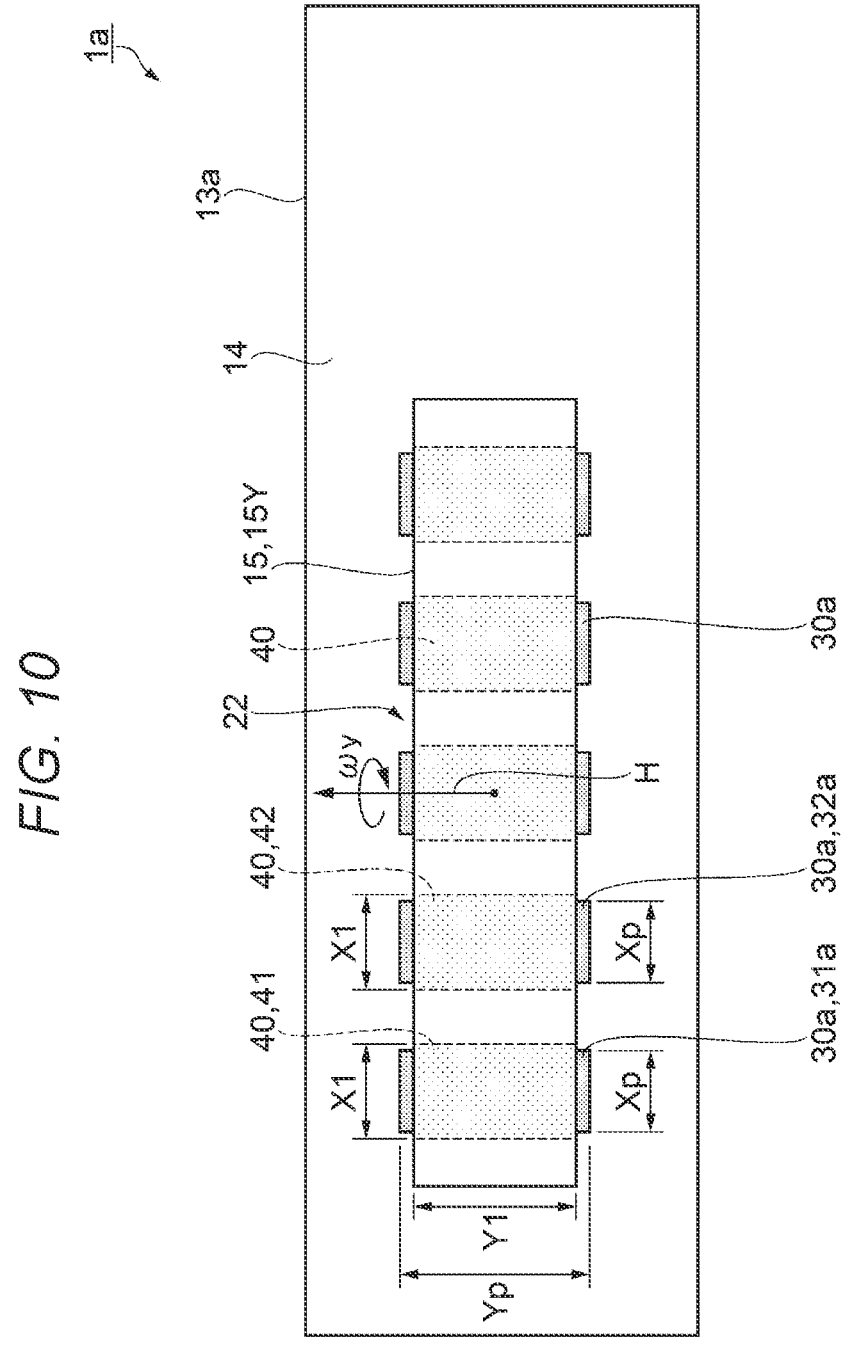
FIG. 10 is a plan view showing a positional relationship between board land patterns of a circuit board and package electrodes of a sensor package.
Figure 10:
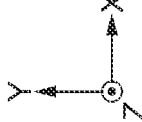

Next, a sensor module 1a according to a second embodiment will be described with reference to FIGS. 9 and 10. In FIGS. 9 and 10, wirings and circuit components such as resistors and capacitors provided on a circuit board 13a are not shown for the convenience of description.

The sensor module 1a according to the present embodiment is similar to the sensor module 1 according to the first embodiment except that a shape of a board land pattern 30a provided on the circuit board 13a is different from that in the sensor module 1 according to the first embodiment. Differences from the first embodiment described above will be mainly described, and description of the same matters will be omitted.

In the sensor module 1a, as shown in FIGS. 9 and 10, a width Xp of a first board land pattern 31a in the first direction is equal to or smaller than the width X1 of the first package electrode 41 in the X direction that is the first direction, and a width Xp of a second board land pattern 32a in the first direction is equal to or smaller than the width X1 of the second package electrode 42 in the X direction that is the first direction. That is, the first board land pattern 31a and the first package electrode 41, as well as the second board land pattern 32a and the second package electrode 42 satisfy Xp≤X1, and two board land patterns 30a of which the width Xp of the board land pattern 30a in the first direction is equal to or smaller than the width X1 of the package electrode 40 in the first direction are formed on the circuit board 13a. Therefore, it is possible to further prevent deviation of the detection axis H due to the rotation of the sensor package 15 in the direction of the flat surface 14 of the circuit board 13a which occurs at the time of a solder reflow.

With such a configuration, it is possible to obtain the same effect as the effect of the sensor module 1 according to the first embodiment.

3. Third Embodiment

Next, a sensor module 1b according to a third embodiment will be described with reference to FIGS. 11 and 12. In FIG. 12, wirings and circuit components such as resistors and capacitors provided on a circuit board 13b are not shown for the convenience of description.

The sensor module 1b according to the present embodiment is similar to the sensor module 1 according to the first embodiment except that a shape of a board land pattern 30b provided on the circuit board 13b and a shape of a package electrode 40b provided on the mounting surface 16 of a sensor package 15b are different from those in the sensor module 1 according to the first embodiment. Differences from the first embodiment described above will be mainly described, and description of the same matters will be omitted.

Figure 11:
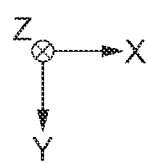
FIG. 11 is a plan view showing package electrodes of a sensor package provided in a sensor module according to a third embodiment.
Figure 12:
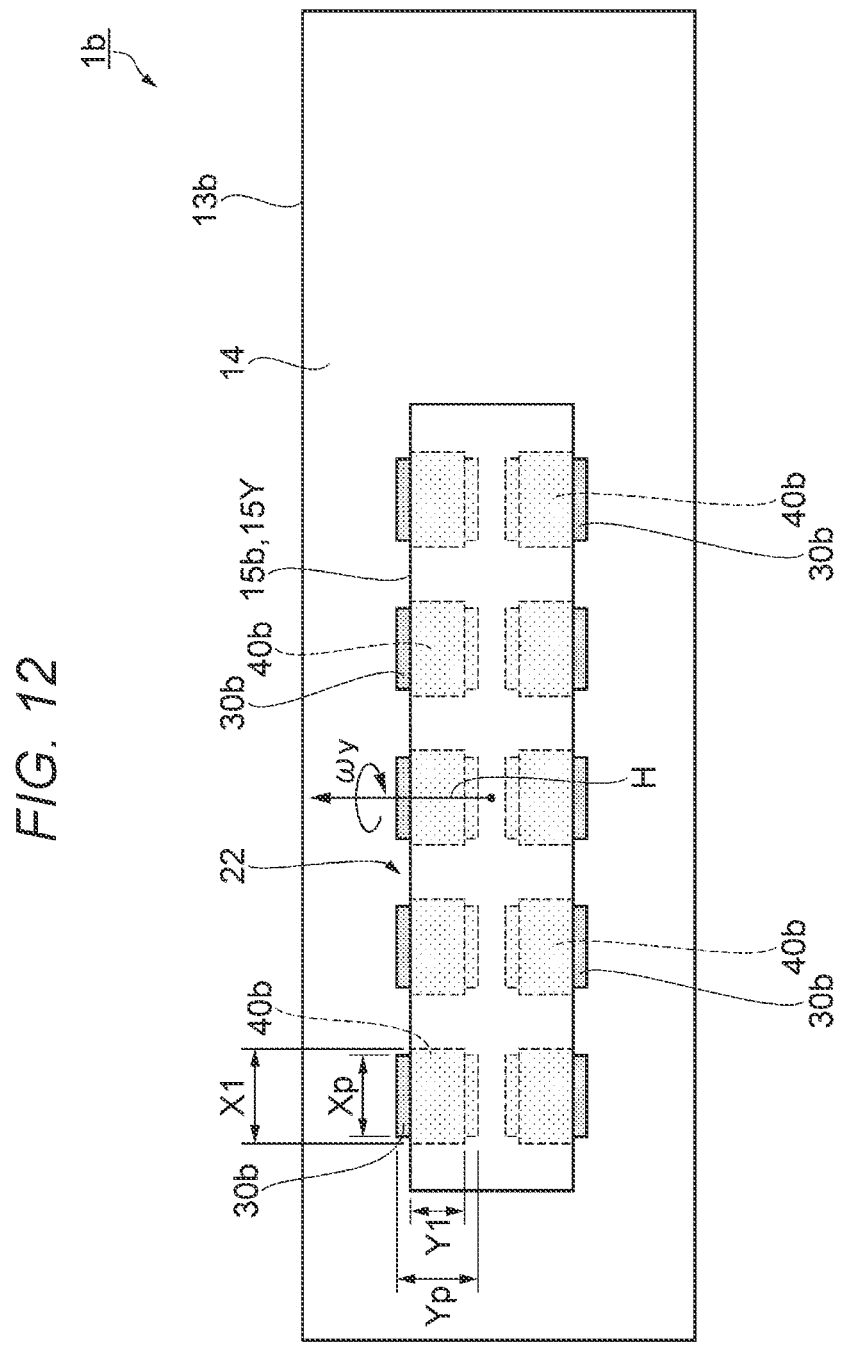
FIG. 12 is a plan view showing a positional relationship between board land patterns of a circuit board and the package electrodes of the sensor package.
Figure 12:
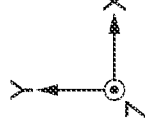

As shown in FIG. 11, the sensor module 1b includes the sensor package 15b in which a plurality of package electrodes 40b are disposed on the mounting surface 16 of the sensor package 15b. The plurality of package electrodes 40b are arranged side by side in the X direction on an end portion of the mounting surface 16 at a positive side in the Y direction and an end portion of the mounting surface 16 at a negative side in the Y direction. As shown in FIG. 12, a plurality of board land patterns 30b are arranged on the circuit board 13b at positions overlapping the package electrodes 40b of the sensor package 15b in a plan view.

A width Xp of the board land pattern 30b in the first direction is equal to or smaller than a width X1 of the package electrode 40b in the first direction, that is, Xp≤X1. A width Yp of the board land pattern 30b in the second direction is larger than a width Y1 of the package electrode 40b in the second direction, that is, Yp>Y1.

With such a configuration, it is possible to obtain the same effect as the effect of the sensor module 1 according to the first embodiment.

What is claimed is:
1. A sensor module comprising:
three axes orthogonal to each other being defined as an X axis, a Y axis, and a Z axis;

a base portion having a plurality of lead frames and made of a mold resin;

a circuit board arranged in a plane of the base portion perpendicular to the Z axis;

a first inertial sensor and a second inertial sensor respectively mounted on a surface of the circuit board perpendicular to the Z axis; and a cap covering the first inertial sensor, the second inertial sensor, and the circuit board, the cap being joined to the base portion, wherein the first inertial sensor includes:

a first sensor element having a detection axis; and a first sensor package accommodating the first sensor element, wherein the first inertial sensor is a Y-axis angular velocity sensor element that detects an angular velocity around the Y axis, the first sensor package is rectangular in a plan view and includes:

a first main surface and a second main surface outwardly opposite to each other along the Y axis;

a pair of first side surfaces outwardly opposite to each other along the Z axis, the pair of first side surfaces connecting the first main surface and the second main surface; and a pair of second side surfaces outwardly opposite to each other along the X axis, the pair of second side surfaces connecting the first main surface and the second main surface, one of the pair of first side surfaces is a mounting surface mounted on the surface of the circuit board, and the other of the pair of first side surfaces is an opposite surface, a first castellation extends from the first main surface to the second main surface and is provided on the mounting surface, a second castellation extends from the first main surface to the second main surface and is provided on the opposite surface, a first package electrode of the first sensor package is provided on a first curved inner surface of the first castellation, a second package electrode of the first sensor package is provided on a second curved inner surface of the second castellation, a board land pattern is provided on the surface of the circuit board, the mounting surface of the first sensor package is mounted on the surface of the circuit board along the X axis by soldering between the board land pattern and the first package electrode at a joined location, Xp<X1, in which Xp is a width of the board land pattern along the X axis at the joined location, and X1 is a width of the first package electrode along the X axis at the joined location, an entirety of the first curved inner surface of the first castellation directly faces the board land pattern along the Z axis, the second castellation and the second package electrode are not directly connected to the board land pattern and do not face is not located directly adjacent to the board land pattern, wherein the second inertial sensor includes:

a second sensor element having a detection axis; and a second sensor package accommodating the second sensor element, wherein the second inertial sensor is a Z-axis angular velocity sensor element that detects an angular velocity around the Z axis, the second sensor package is rectangular in the plan view and includes:

a third main surface and a fourth main surface outwardly opposite to each other along the Z axis;

a pair of third side surfaces outwardly opposite to each other along the Y axis, the pair of third side surfaces connecting the third main surface and the fourth main surface; and a pair of fourth side surfaces outwardly opposite to each other along the X axis, the pair of fourth side surfaces connecting the third main surface and the fourth main surface, one of the third and fourth surfaces is a mounting surface mounted on the surface of the circuit board, and the other of the third and fourth surfaces is an opposite surface, a third castellation extends from the third main surface to the fourth main surface and is provided on the mounting surface, a fourth castellation extends from the third main surface to the fourth main surface, a third package electrode of the second sensor package is provided on a third curved inner surface of the third castellation, a fourth package electrode of the second sensor package is provided on a fourth curved inner surface of the fourth castellation, another board land pattern is provided on the surface of the circuit board, and the mounting surface of the second sensor package is mounted on the surface of the circuit board along the X axis by soldering between the another board land pattern and the third and fourth package electrodes at a joined location.

2. The sensor module according to claim 1, further comprising:

a first board land pattern provided on the surface of the circuit board, wherein the first sensor package includes the first package electrode joined to the board land pattern and another package electrode joined to the first board land pattern, and at least one of the board land pattern and the first package electrode or the first board land pattern and the another package electrode satisfies Xp<X1.

3. The sensor module according to claim 1, further comprising:

a first board land pattern provided on the surface of the circuit board, wherein the first sensor package includes the first package electrode joined to the board land pattern and another package electrode joined to the first board land pattern, and the board land pattern and the first package electrode, as well as the first board land pattern and the another package electrode satisfy Xp<X1.

4. The sensor module according to claim 1, wherein Yp>Y1, in which

Yp is a width of the board land pattern along the Y-axis, and

Y1 is a width of the first package electrode along the Y-axis.

* * * * *